United States Patent [19]

Nahory et al.

[11] 3,995,303
[45] Nov. 30, 1976

[54] GROWTH AND OPERATION OF A STEP-GRADED TERNARY III-V HETEROJUNCTION P-N DIODE PHOTODETECTOR

[75] Inventors: Robert Edward Nahory, Middletown; Thomas Perine Pearsall, Navesink; Martin Alan Pollack, Westfield, all of N.J.

[73] Assignee: Bell Telephone Laboratories, Incorporated, Murray Hill, N.J.

[22] Filed: June 5, 1975

[21] Appl. No.: 583,964

[52] U.S. Cl. ................................ 357/30; 357/16; 357/17; 357/18; 357/61
[51] Int. Cl.[2] ................ H01L 27/14; H01L 29/164
[58] Field of Search ............... 357/30, 16, 61, 18, 357/17

[56] References Cited
UNITED STATES PATENTS

| | | | |
|---|---|---|---|
| 3,675,026 | 7/1972 | Woodall | 250/211 J |
| 3,814,993 | 6/1974 | Kennedy | 357/30 |
| 3,881,113 | 4/1975 | Rideout | 250/551 |
| 3,889,143 | 6/1975 | Gowers | 313/94 |
| 3,889,284 | 6/1975 | Schiel | 357/30 |
| 3,955,082 | 5/1976 | Dyment | 250/211 J |

OTHER PUBLICATIONS

Milnes, A., Heterojunctions and Metal–Semiconductor Junctions, Academic Press N.Y., 1972 pp. 115–119.

Eden, R. 1.06 Micron Avalanche Photodiode, Technical Report AFAL-TR-72-343, Jan. 1973.

*Primary Examiner*—Martin H. Edlow
*Attorney, Agent, or Firm*—Wilford L. Wisner; James F. Hollander

[57] ABSTRACT

In an infrared photodetection apparatus a photodetector diode is used which comprises a heterojunction of two epitaxial layers of differing compositions of a ternary III–V semiconductive alloy, such that the outer layer will serve as a radiation-admitting window as well as physical protection for the underlying absorbing layer in the so called direct photodetector diode configuration. The ternary alloy illustratively includes two metallic group III elements such as indium and gallium; but the principle can be extended to ternary alloys including two group V elements, such as arsenic and antimony. Further, quaternary alloys of III–V elements can be employed. The absorbing layer is selected to be substantially intrinsic. The latter is the case for an N-type layer of $In_xGa_{(1-x)}As$. Matching of this absorbing layer to a gallium arsenide substrate is achieved by a plurality of step-graded composition layers of indium gallium arsenide.

10 Claims, 10 Drawing Figures

RELATIVE RESPONSE OF $In_x Ga_{1-x} As$ DETECTOR AT 0 REVERSE BIAS

GROWTH AND OPERATION OF A STEP-GRADED TERNARY III-V HETEROJUNCTION P-N DIODE PHOTODETECTOR

BACKGROUND OF THE INVENTION

This invention relates to a photodetector useful in the near infrared portion of the spectrum, for example, at about 1.06 micrometers.

The near infrared wavelengths between about 0.8 $\mu$m and about 1.3 $\mu$m have recently acquired significance as the wavelengths of interest for future optical fiber communication systems. Such systems have the potential of supplying very large communication bandwidth, when appropriately implemented.

Intensive research has been directed toward the achievement of suitable components for such a system. One of the needed components is a photodetector. This is especially true since the standard silicon diode photodetector is of diminishing efficiency at wavelengths longer than about 1 $\mu$m.

A number of exotic photodetectors of semiconducting compounds have been proposed; but many of them have either slow response times or excessive dark currents, partly because of their relatively small semiconductive bandgap energies.

An additional drawback to such new detectors is that many of them use relatively untried material systems. Next to the well-known silicon and germanium semiconductive material systems, the gallium arsenide material system is one of the most extensively investigated and developed material systems.

Therefore, it would be desirable to have a new and efficient photodetector element for the near infrared region of the spectrum which is compatible with the gallium arsenide material system at least to the extent of using gallium arsenide single crystal substrates. Indeed, it is contemplated that several types of gallium arsenide devices may be used in apparatuses designed to be compatible with fused silica optical fiber communication systems.

While some devices using possibly compatible diodes have been proposed, each has a drawback from the viewpoint of overall efficiency. For example, the gallium arsenide antimonide photodetector described by R. C. Eden, Proceedings of the IEEE, Volume 63, Page 32, Jan. 1, 1975, uses the so-called inverted configuration, so that the photons must travel through the relatively thick substrate and therefore suffer excessive free carrier loss.

SUMMARY OF THE INVENTION

According to our invention, near infrared photodetection, optionally including avalanche characteristics, is provided by heterodiodes of III–V semiconductive ternary or quaternary alloys is a so-called direct reception single heterojunction configuration. A principal feature of the new photodetector diode is the use of two epitaxial single crystal layers that form the heterojunction between them, the larger bandgap one of the layers serving as the window and as a thin protective layer for the absorbing layer of the photodiode. By the phrase direct reception configuration, we mean that the light enters the absorbing region of the diode relatively directly without passing through the thick supporting substrate of the diode. The absorbing epitaxial layer of the diode is chosen so that the layer is substantially intrinsic or very lightly doped. The window epitaxial layer, which varies in the quantities of its column III and column V elements by a few percent from the absorbing layer, is of the opposite conductivity type.

BRIEF DESCRIPTION OF THE DRAWING

Further features and advantages of our invention will become apparent from the following detailed description, taken together with the drawing, in which.

DESCRIPTION OF ILLUSTRATIVE EMBODIMENT

Figure 1:
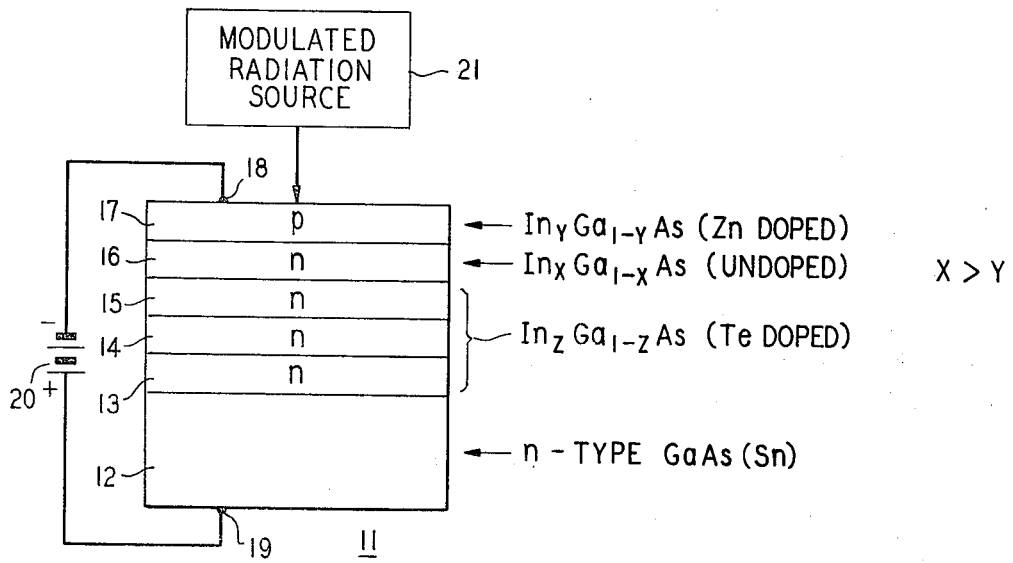
FIG. 1 is a partially pictorial and partially schematic illustration of an illustrative embodiment of our invention.

The embodiment of FIG. 1 is a photodiode detector which is believed to fill a long-existing need in the choice of solid state detectors in general and in the choice of photodetector diodes for use with low loss optical fiber communication apparatus operating in the vicinity of 1.06 $\mu$m.

In the device of FIG. 1 the photodetector diode 11 includes a gallium arsenide substrate 12, a plurality of step-graded matching layers 13, 14, and 15, and a pair of epitaxial single crystal layers 16 and 17 of opposite conductivity types which form the operative portions of the photodetector heterodiode. In other words, the interface between the epitaxial layers 16 and 17 is the heterojunction of the photodiode; and the depletion region of the reverse bias diode is formed at or near this heterojunction. The device is completed by ohmic contacts 18 and 19 attached to the epitaxial layer 17 and the substrate 12 respectively and connected to the negative and positive terminals of reverse biasing voltage source 20. For reverse bias, it is noted that the negative terminal source 20 is oriented toward the p-type epitaxial layer 17 and its positive terminal is oriented toward the n-type substrate 12.

In more detail, the substrate 12 is of n-type gallium arsenide doped with tin or other n-type dopant to a concentration of $2\times10^{18}$ charge carriers per cubic centimeter and each of the step-graded matching layers 13, 14 and 15 are of indium gallium arsenide in which the indium content progressively increases from 8 percent of the metallic content in layer 13 to 16 percent of the metallic content in layer 15. Layers 13 through 15 are grown by liquid phase epitaxy on the substrate 12 which is oriented to have the well-known < 111B > crystalline orientation, which is usually the most suitable for liquid phase epitaxy for indium gallium arsenide. The successive layers are progressively lightly doped with tellurium or other donor impurity. The approximately 2–10 percent steps in the indium concentration occurring progressively from the substrate 12, to layer 13, layer 14, layer 15 and layer 16 accommodate the difference in lattice constant between that of gallium arsenide substrate 12, and that of the absorbing epitaxial layer 16, which has an 18 percent indium content. More specifically, the epitaxial single crystal layer 16 is of the formula $In_{0.18}Ga_{0.82}As$ and is essentially undoped or lightly doped in order to have no more than $1 \times 10^{16}$ donors per cubic centimeter.

The deposition of layer 16 is followed by the liquid phase epitaxial deposition of the more highly doped p-type single crystal layer 17, which is doped with zinc to provide $1 \times 10^{18}$ donors per cubic centimeter. Illustratively, the indium content of layer 17 is 16 percent of the metallic content and its thickness is only about $2 \times 10^{-3}$ millimeters, which is substantially less than that of most epitaxial layers deposited under an ohmic contact such as contact 18. Thereby its bandtail absorption for the modulated radiation at 1.06 $\mu$m from source 21 is held to a level which enables the diode 11 to be both fast and efficient. Not only will the bandtail absorption be small but the radiative recombination loss in epitaxial layer 17 is thereby kept small.

Figure 2:
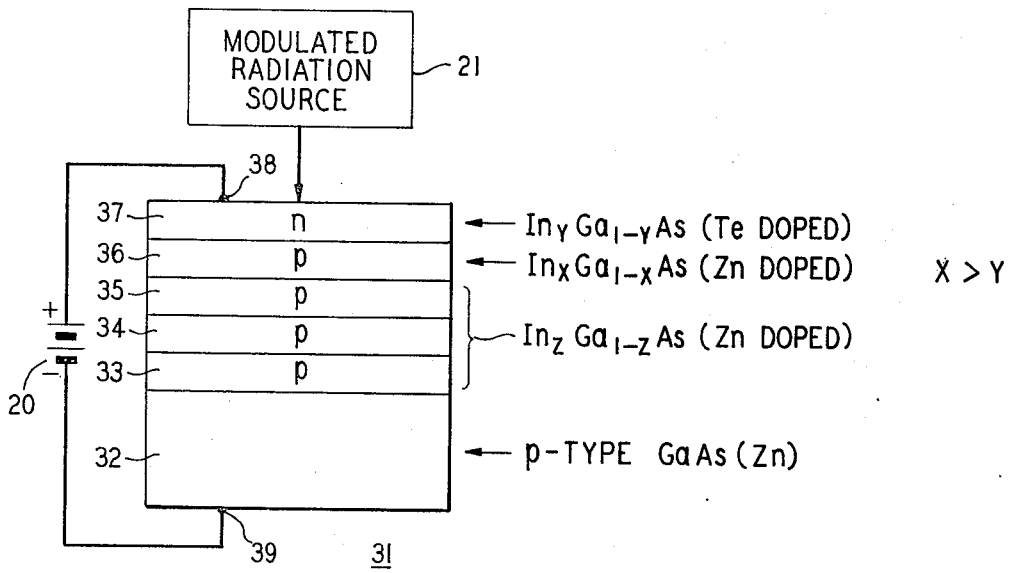
FIG. 2 shows a modification of the embodiment of FIG. 1.

While contacts 18 and 19 are shown in FIGS. 1 and 2 to be of limited area, contact 19 would more usually be a conductive plate underlying all of substrate 12; and contact 18 would be of an annular or ring type or otherwise be partially transmissive in order to admit the radiation from source 21 to layers 17 and 16 in succession.

In the fabrication of the device of FIG. 1 each layer is grown from a separate solution in a horizontal furnace with a graphite boat and slider to move the substrate from well to well. The basic procedures are well-known in the liquid phase epitaxial arts.

Modifications from the standard procedures are necessary to grow successfully the ternary crystal indium gallium arsenide on the binary gallium arsenide substrate. Growth must be caused to occur on the < 111B > crystal face of the substrate to insure planarity of interfaces between the layers. The solutions from which growth occurs are prepared from exact compositions desired in the respective solutions of indium, gallium, and indium arsenide, where the proportions are those appropriate to supersaturation at the growth temperature; and all the material is heated to a higher temperature than the growth temperature to be in the molten state prior to the growth of the layers.

Growth is begun from a solution at a temperature specifically about 1° below its liquidus, or equilibrium, temperature, and thus from a supersaturated solution. The solution is supersaturated because, if it had never been heated to a higher temperature, there would be crystals of excess gallium arsenide floating in the solution at the temperature at which growth commences.

The three lattice-matching layers 13, 14 and 15 are each typically 2 $\mu$m ($2 \times 10^{-3}$ mm) thick. Growth is carried out at temperatures near 850° C in an ambient of flowing hydrogen gas. Each layer is grown at a temperature about 2° lower in temperature than the last layer, so that nucleation from the supersaturated solution of each stage of growth always commences on the previously grown layer.

After growth of the wafer it is removed from the furnace, mechanically cleaned and then chemically cleaned in HCl. A shallow zinc diffusion is made on the p-side of the wafer, that is to the p-type layer 17, to facilitate deposition of an ohmic contact, as described above. The resultant photodiodes 11 preferably are processed so that after growth they have an active area of about $1 \times 10^{-4} cm^2$. They can be of either a mesa type of structure in which layers 16 and 17 are less extensive laterally than the remainder of the device; but if not of a mesa structure the entire device 11 will typically have transverse dimensions of about 0.1 mm in each direction. The thickness of substrate 12 will typically be somewhat less than 0.05 mm and the thickness of the layers 13 through 17 together is about 10–20 $\mu$m. Absorbing layer 16 may be as thick as 4 $\mu$m, in which case it would typically be grown with a 4° C temperature drop.

It is envisioned that the modulated radiation source 21 would typically be an optical fiber communication link operating at about 1.06 $\mu$m; but it could also be any other source of modulated radiation at about the wavelength.

Figure 3:
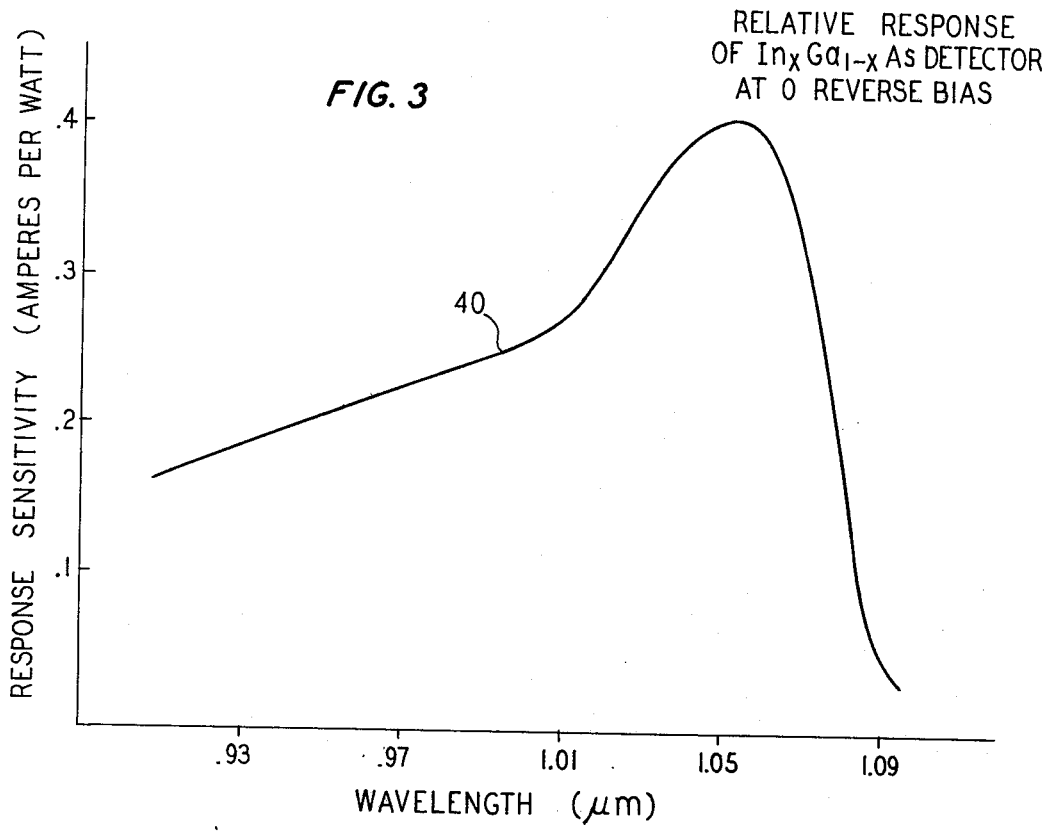
FIG. 3 shows a curve useful in explaining the operation of the embodiment of FIG. 1.

In operation, the spectral response of these diodes in the near infrared range from about 0.9 $\mu$m to about 1.09 $\mu$m is shown in curve 40 of FIG. 3. The wavelength in micrometers is given along the horizontal axis, the abscissa, and the response sensitivity in amperes per watt is shown along the vertical axis, the ordinate. The response shown by curve 40 peaks at about 1.06 $\mu$m and shows good sensitivity down to less than 1.0 $\mu$m. The dark current of the diode of FIG. 1 was measured in several different samples over a range of temperatures from 77° K to 300° K. The dark current in the diode at room temperature is within an order of magnitude of that obtained in state-of-the-art silicon devices and is several orders of magnitude better than that obtained in state-of-the-art germanium devices. We consider that this dark current result is quite significant for the potential use of these devices in fiber optical communication systems.

A diode such as that of FIG. 1 can be operated in the avalanche region for reverse biases greater than about 40 volts from source 20. This level of reverse bias will create a depletion region extending throughout most of layer 16.

To obtain avalanching with an optimum signal-to-noise condition one wishes to initiate impact ionization in layer 16, by holes.

When a carrier has sufficiently high energy, it can create an additional hole-electron pair at a collision which occurs in the normal course of transit through an electric field existing in the solid material. For an electric field of about $3 \times 10^{-5}$ volts per centimeter, the distance between ionizing collisions is about 1 $\mu$m. An electron and a hole each, statistically, possess a so-called ionization threshold energy. In the usual case, these threshold energies are different for electrons and holes. The more efficient ionizing carrier has a lower threshold energy. Hence, for a given electric field, this carrier will create more electron-hole pairs per length of crystal traversed than will the other. In amplification by avalanche gain, the best signal-to-noise ratio is obtained if only one type of carrier is creating additional electron-hole pairs. It follows that the carrier to pick to initiate ionization should be the one with the lowest threshold energy. Suppose this carrier were a hole. If the reverse bias is high enough so that holes could create electron-hole pairs, but low enough so that electrons could not do so, then the optimum condition for obtaining avalanche gain would be achieved.

The foregoing set of conditions is not peculiar to avalanching by holes or to the use of n-type material in which avalanche gain occurs. Thus, for a material in which electrons can create impact ionization most efficiently and therefore have the lowest impact ionization threshold energy, the device would also be biased so that in the depletion region only electrons could create electron-hole pairs and thus avalanche gain. As we will see hereinafter, that is the case for the gallium arsenide antimonide devices described hereinafter.

For a given reverse bias, the requirement for maximum signal-to-noise ratio is that the most efficient ionizing carrier, that one with the lowest impact ionization threshold energy, enter the high field depletion region by itself. In this manner, the proper carrier to initiate ionization can experience the maximum electric field which occurs at the junction edge; and relatively little impact ionization will be caused by the majority carriers generated in the avalanching process relatively near to that highest field portion of the depletion region. Therefore, there will be little noise generated by avalanching by the less efficient carrier.

In the modified embodiment of FIG. 2, reverse bias source 20, except for polarity, and modulated radiation source 21 remain the same as in FIG. 1. The diode 31 is modified by changes in the doping of the various epitaxial layers such that the absorbing region can now be placed in p-type material in the $In_{0.18}Ga_{0.82}As$ epitaxial layer 36 which is very lightly doped with zinc to provide diodes with an effective carrier concentration of about $1\times10^{16}$ holes per cc. A p-type gallium arsenide substrate 32, zinc-doped to $1\times10^{18}$ holes per cm$^3$, can then be used; and the intervening step-graded matching layers 33 through 35 would typically be doped with zinc to decreasing concentrations as layer 36 is approached. The window epitaxial layer 37 would than be n-type $In_{0.16}Ga_{0.84}As$ doped with tellurium to have an electron carrier concentration of about $1\times10^{18}$ per cc.

Nevertheless, the arrangement of FIG. 2 is not the preferred structure for a photodiode according to our invention since the depletion region now occurs in layer 36; and the most efficient ionization of carriers is still carried out by holes, which are now the majority carriers of the layer 36. Therefore, the noise level of the diode 31 of FIG. 2 is expected to be higher than that of diode 11 of FIG. 1. The difference in structure of the diode shown in FIG. 2 is shown mainly for the tutorial advantage that the roles of the layers can be reversed where appropriate, and, indeed, that may be the case for gallium arsenide antimonide used in place of indium gallium arsenide since the most efficient carriers for ionizing in gallium arsenide antimonide are the electrons. In any event, it is usually preferred that the conductivity type of the absorbing layer be chosen so that its minority carriers are the most efficient carriers for avalanche ionization.

Figure 4A:
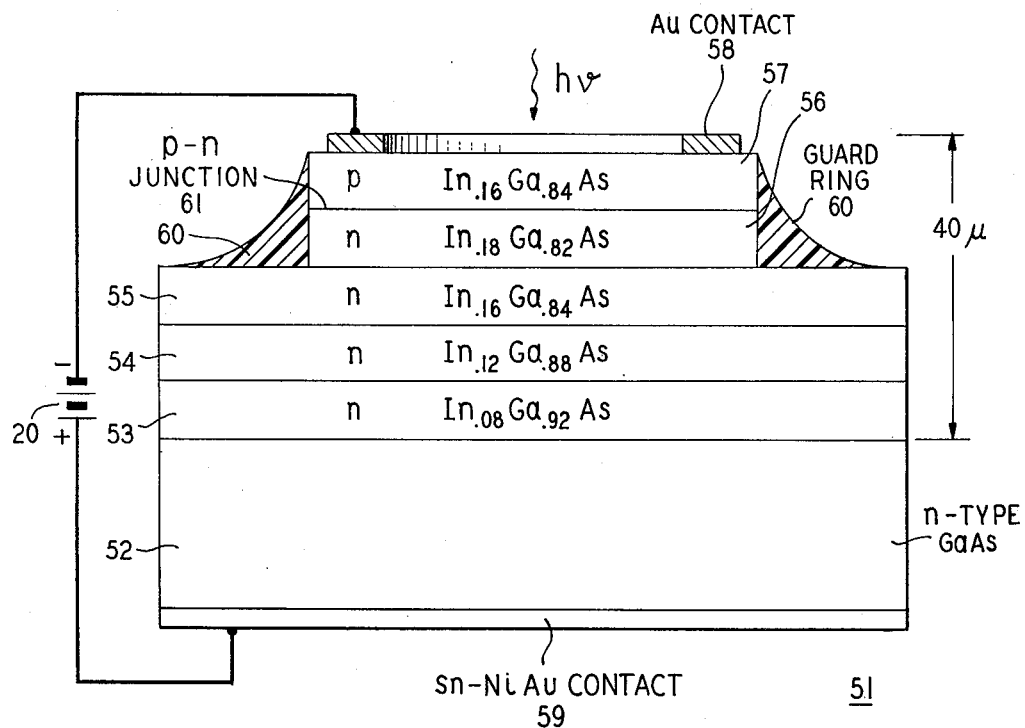
FIGS. 4A and 4B show two orthogonal views, the first partly in section, of a preferred embodiment of our invention.
Figure 4B:
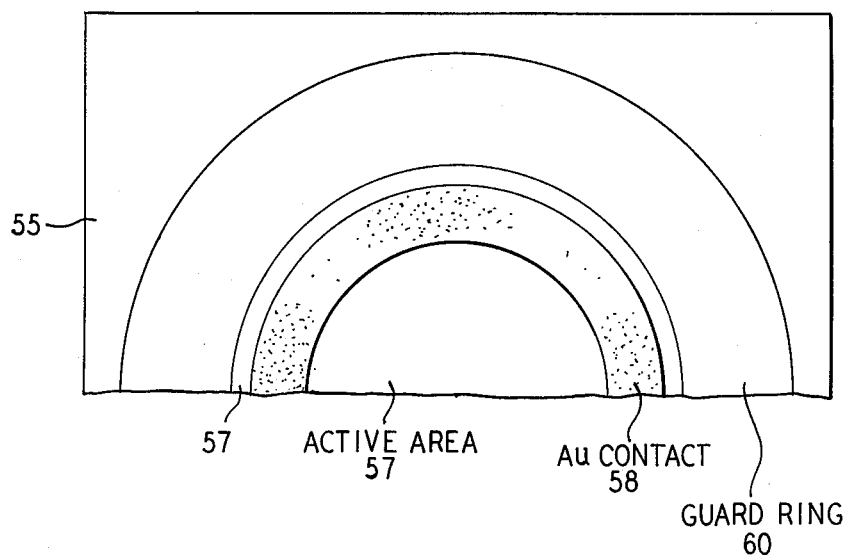

The modified embodiment of FIGS. 4A and 4B illustrate in detail how the device is arranged to permit it to be of the so-called direct configuration, rather than the inverted configuration in which the incident modulated light enters through the substrate.

Specifically, the n-type gallium arsenide substrate like that in FIG. 1 is alloyed to the tin-nickel-gold contact 59 which is an ohmic contact of substantial thickness, since it is not required to pass the incident radiation. Upon substrate 52, of about 0.05 mm thickness, a mesa-type structure is erected by depositing first the step-graded matching layers 53 through 55 as before with the indium content for each one being 8 percent, 12 percent and 16 percent of the metallic content, respectively. Layers 53 through 55 each have effective electron charge carrier concentrations of $2\times10^{16}cm^{-3}$. The top two epitaxial single crystal layers 56 and 57 are then deposited in a mesa-type configuration with the same concentrations of indium and of dopant impurities as the corresponding layers 16 and 17 in FIG. 1. In this case, the lateral extent of layers 56 and 57 will be substantially less than that of the underlying substrate 52 and epitaxial layers 53 through 55, whereas substrate 52 has lateral dimensions of 0.5mm × 0.5mm. The effective reception area of epitaxial layer 57 inside of the annular contact 58 will be about $1\times10^{-4}cm^2$ of generally circular shape. The annular gold contact 58 is deposited by well-known evaporation deposition techniques with the aid of masks which are subsequently removed. The guard ring 60 of isolating dielectric material such as silicon dioxide is deposited around the mesa structure as shown. The generally circular nature of all the deposits above the last step-graded layer 55 is shown readily in the top view of FIG. 4B.

In the operation of the device of FIG. 4A it should again be apparent that the p-type window layer 57 has a sufficiently larger bandgap because of its lower indium concentration and a sufficiently small thickness, less than $2\times10^{-3}$mm, to have negligible bandtail absorption and thus to be transparent at 1.06 $\mu$m.

The incident 1.06 $\mu$m light is absorbed strongly in the n-type epitaxial layer 56, in which the indium content is 18 percent of the metallic content. The light is absorbed by creation of electron-hole pairs near the heterojunction 61 in the depletion region which is principally on the n-type side of the heterojunction. These pairs diffuse in opposite directions with respect to the junction, the electrons toward the n-type side and the holes toward the p-type side. In the presence of the relatively strong reverse bias, 40 volts for example, from source 20 these photocarriers can supply inelastic collisions in which the energy loss is taken up by ionization of more charge carriers, thus amplifying the signal.

The guard ring 60 suppresses unwanted leakage or discharges at discontinuities at the device boundaries, as the leakage or discharge would tend to short the heterojunction 61.

Figure 5:
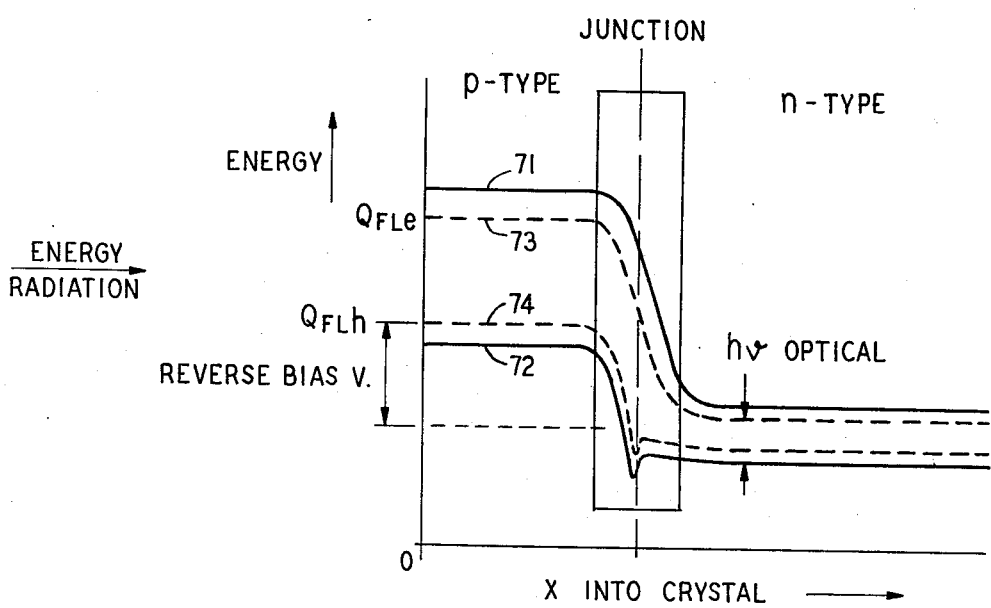
FIG. 5 shows curves useful in explaining the theory and operation of the various embodiments.

The energy band structure of the various layers creating the rectifying properties of the device are shown in the energy versus distance curves of FIG. 5. Thus, curves 71 through 74 illustrate what is commonly called the potential barrier in the vicinity of the heterojunction. The horizontal axis, the abscissa, shows distance orthogonal to the junction 61, starting from the face of layer 57 at which energy is admitted. The curves 71 through 74 start to bend at the point where the depletion region begins. Indeed, the characteristic for the holes depicted by curves 72 and 74 shows a spike in the vicinity of the heterojunction 61. The curves 71 and 73 for the electrons do not show a similar characteristic in the vicinity of the heterojunction but continue to decline monotonically until the highly doped n-type regions are reached. The distance between curves 71 and 72 represents the bandgap of the material at the particular point in the crystal, and the distance between the curves 73 and 74, shown dotted, represents the separation of the socalled quasi-Fermi energy levels for the respective charge carriers. The ordinate of the curve 74 at the outer surface of layer 57 is designated as $Q_{FLh}$, where the subscript stands for quasi-Fermi level of the holes, as indicated by the ordinate of FIG. 5. The reverse bias of the diode is also indicated along the ordinate. This reverse bias is seen to extend between the level $Q_{FLh}$ and a point just short of the maximum energy of holes near the junction. The general shape of curves 71–74 also applies to the other embodiments.

Figure 6:
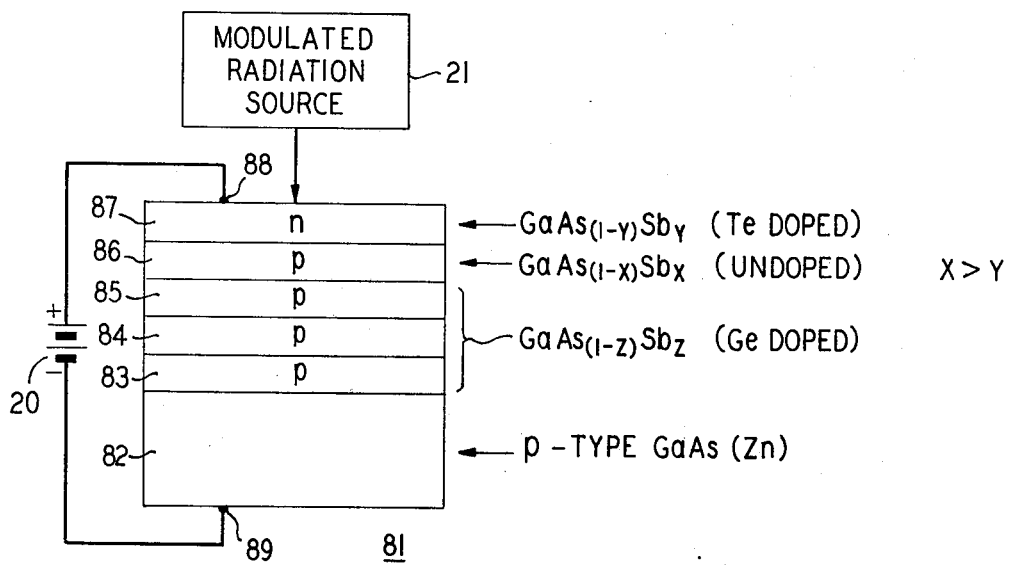
FIG. 6 shows a modification of the embodiment of FIG. 1 using $GaAs_{1-x}SB_x$.

In the embodiment of FIG. 6 $GaAs_{(1-x)}Sb_x$ is substituted for $In_xGa_{1-x}As$. The substrate 82 is again single crystal GaAs which is doped with zinc to be p-type with a concentration of $1\times10^{18}$ acceptors per cubic centimeter, providing about $1\times10^{18}$ holes per cubic centimeter. The matching layers 83, 84 and 85 are all also p-type but include varying proportions of antimony (Sb).

For layer 83 the $x$ in the preceding formula is 0.025 and the $(1-x)$ is 0.975. Growth of this layer is commenced at about 798° C after heating the entire furnace to 800° C initially. Growth occurs from a solution with Ga, Sb, and excess GaAs to insure saturation. Supersaturation is not needed; so growth commences at a temperature very near to the 800° C at which all components of the successive solutions are melted.

Layer 84 is grown with $x = 0.058$ and correspondingly $(1-x) = 0.942$, and growth commences at about 796° C.

Layer 85 is grown with $x = 0.093$ and $(1-x) = 0.907$. Growth commences at about 794° C.

Each of the layers 83 through 85 is doped with germanium with decreasing concentrations as layer 86 is approached. For example, layer 83 would have about $2\times10^{17}$ charge carriers per cubic centimeter. Each of the layers 83 through 85 is about 2 $\mu$m thick.

The absorbing layer 86 is grown with $x = 0.13$ and $(1-x) = 0.87$; and growth is commenced at about 790° C. As a result of the larger temperature increment, a layer 86 about 4 $\mu$m thick is grown. Layer 86 is also very lightly doped with germanium to provide about $1\times10^{16}$ holes per cubic centimeter.

The top layer 87 is grown with $x = 0.093$ and $(1-x) = 0.907$ at a temperature of about 788° C so that a layer 87 about 2 $\mu$m thick is formed. Layer 87 is doped with tellurium to be n-type with an effective electron charge carrier concentration of about $2\times10^{18}$ per cc. In the operation of the embodiment of FIG. 6 it is found that this modification of the device of FIG. 1 provides the highest sensitivity avalanche heterodiode we have made to date. The measured value is a gain of 500.

Figure 7:
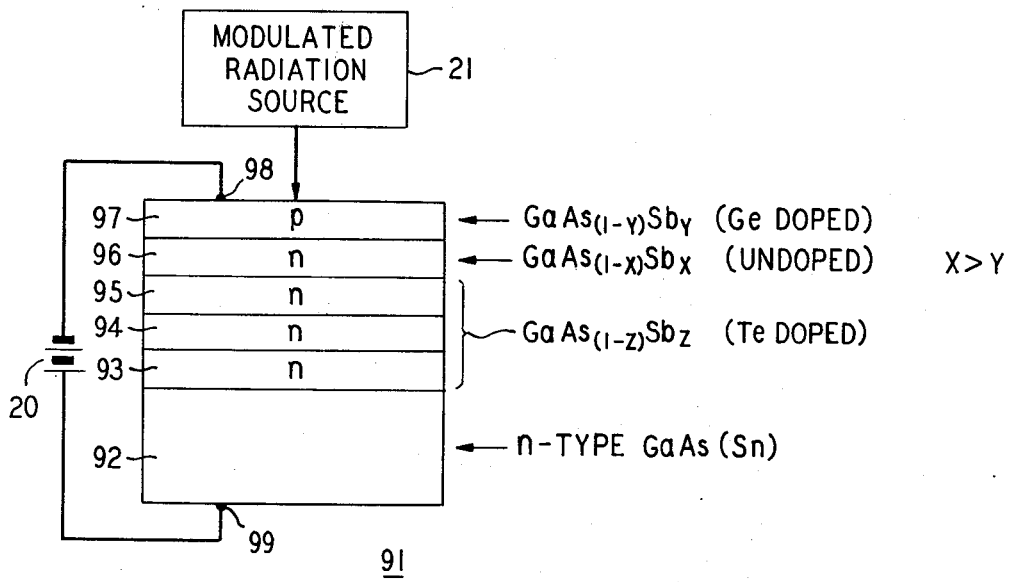
FIG. 7 shows a modification of the embodiment of FIG. 2 using $GaAs_{1-x}SB_x$.

It is, of course, possible to make a $GaAs_{(1-x)}Sb_x$ device with poorer signal-to-noise ratio performance by changing the conductivity type of all the layers. The resulting device would include dopants and conductivity types of the layers as shown in FIG. 1 for $In_{(1-x)}Ga_xAs$, except that p-type layer 97 would preferably be doped with germanium; but it would be degraded in performance with respect to the embodiment of FIG. 6, just as the embodiment of FIG. 2 was degraded in performance with respect to the embodiment of FIG. 1. Basically the noise level would rise in the embodiment of FIG. 7 because both electrons and holes would be avalanching in region 96.

Figure 8A:
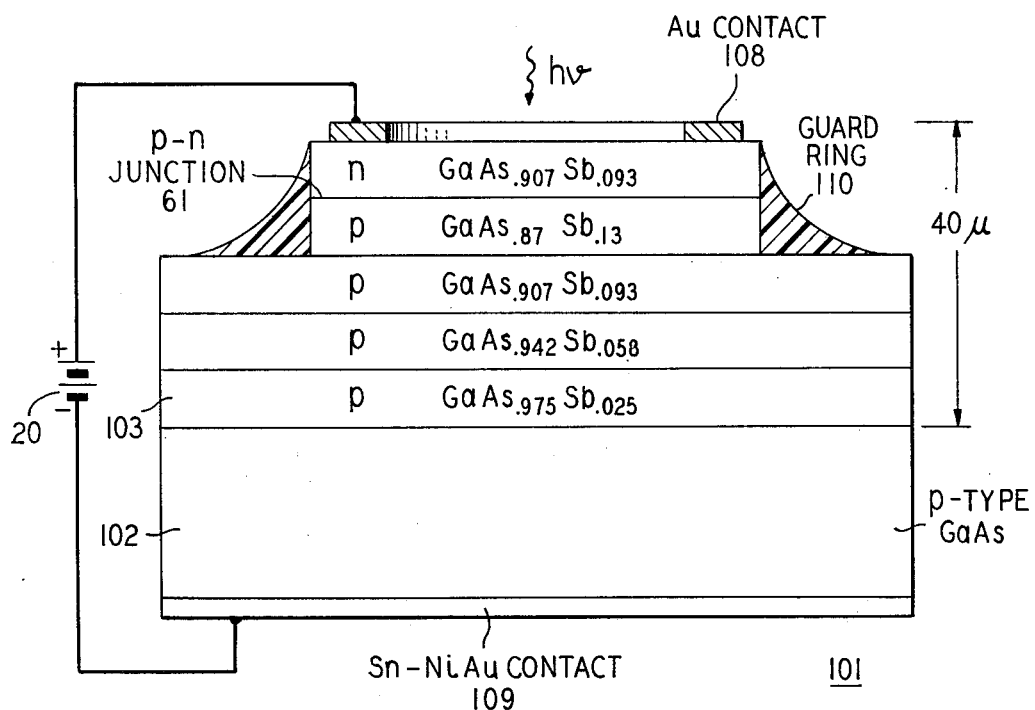
FIGS. 8A and 8B show a modification of the embodiment of FIGS. 4A and 4B using $GaAS_{1-x}SB_x$.
Figure 8B:
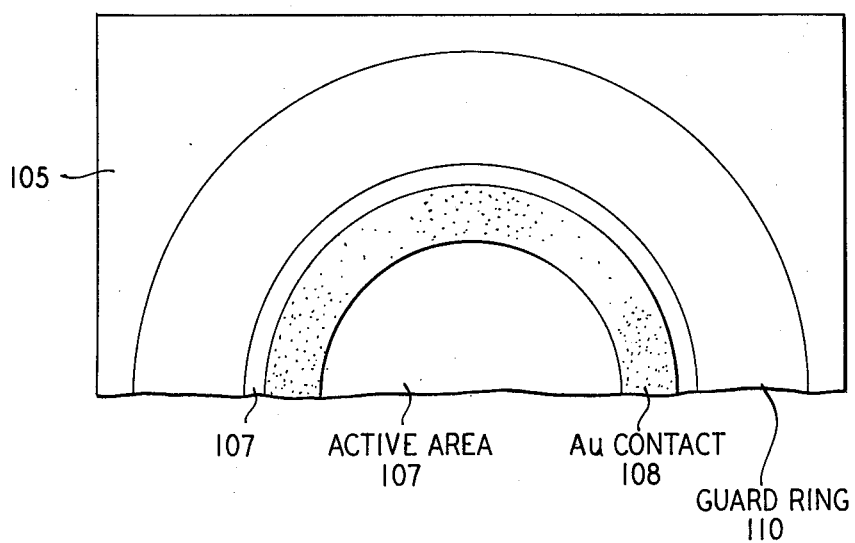

The embodiment of FIG. 6 can be modified to provide a mesa-type device with guard ring in the same way that the embodiment of FIG. 1 was modified by the embodiment of FIG. 4. This modified embodiment of a $GaAs_{(1-x)}Sb_x$ avalanche heterojunction photodiode is shown in FIGS. 8A and 8B. The doping and growth steps are the same as for the device of FIG. 6; but the physical configuration of the layers and the guard ring are accomplished as described above for the embodiment of FIGS. 4A and 4B.

What is claimed is:

1. A photodetector comprising a diode of an n-type gallium arsenide single crystal substrate, a plurality of step-graded matching layers of indium gallium arsenide alloy disposed on said substrate, the matching layer immediately contacting the substrate having the lowest proportion of indium arsenide and the matching layers successively farther from said substrate having successively increasing concentrations of indium, and having successively decreasing n-type charge carrier concentrations, a particular epitaxial layer disposed on the last of said matching layers of very lightly doped n-type $In_xGa_{(1-x)}As$, where $x$ is selected to make the bandgap substantially equal to the energy of the photons to be detected and the charge carrier concentration is substantially less than any other semiconductor portion of said diode, an epitaxial layer of p-type $In_yGa_{(1-y)}As$ disposed on said particular n-type layer, where $y$ is selected to be at least 0.02 less than $x$, said p-type layer forming a window for said photons and a heterojunction with said particular n-type layer, and electrode means for coupling to said particular n-type layer and said p-type layer, said electrode means being adapted to admit said photons first to said p-type layer and thereafter to said particular n-type layer.

2. A photodetector according to claim 1 in which the $In_xGa_{(1-x)}As$ and $In_yGa_{(1-y)}As$ layers and a portion of the electrode means comprise a mesa structure disposed on the matching layers, and including dielectric means for guarding against lateral surface leakage and shorting of the heterojunction of the mesa structure.

3. A photodetector according to claim 1 in which the steps in indium content in each of the matching layers with respect to an adjacent layer vary between 0.02 and 0.10 of the formular metallic content of that layer, and in which $x = 0.18$ and $y = 0.16$ for the particular n-type and p-type layers respectively.

4. A heterojunction photodetector comprising a single crystal substrate, a first epitaxial layer of a $GaAs_{(1-x)}Sb_x$ alloy supported by and protected on a first side by said substrate, said first layer being capable of absorbing substantially all of the photons to be detected and being of a substantially intrinsic conductivity type, a second epitaxial layer of $GaAs_{(1-y)}Sb_y$ alloy, where $x > y$, forming a p-n heterojunction with said first epitaxial layer and being a substantially transparent window for said photons while protecting said first layer on a second side opposite said first side, and electrode means for coupling to said first and second layers, said electrode means being adapted to admit said photons first to said second layer and thereafter to said first layer.

5. A photodetector according to claim 4 in which the first and second epitaxial layers have $x > y$ to an extent sufficient to render substantially negligible the overall absorption of the second epitaxial layer for the photons to be detected, said absorption being primarily the bandtail absorption of said second epitaxial layer.

6. A photodetector according to claim 5 in which the semiconductor alloys composing the first and second epitaxial layers have $x > y$ by at least two percent of the total formular group V element content in said first layer.

7. A photodetector according to claim 5 in which the semiconductor alloys composing the first and second epitaxial layers are $GaAs_{(1-x)}Sb_x$ and $GaAs_{(1-y)}Sb_y$, respectively, where $x$ is about 0.037 greater than $y$.

8. A photodetector comprising a diode of a p-type GaAs single crystal substrate, a plurality of step-graded matching layers of $GaAs_{(1-z)}Sb_z$ alloy disposed on said substrate, the matching layer immediately contacting the substrate having the lowest proportion of gallium antimonide and the matching layers successively farther from said substrate having successively increasing concentrations of antimonide, and having successively decreasing p-type charge carrier concentrations, a particular epitaxial layer disposed on the last of said matching layers of very lightly doped p-type $GaAs_{(1-x)}Sb_x$, where $x$ is selected to make the bandgap substantially equal to the energy of the photons to be detected and the charge carrier concentration is substantially less than any other semiconductor portion of said diode, an epitaxial layer of n-type $GaAs_{(1-y)}Sb_y$ disposed on said particular p-type layer, where $y$ is selected to be at least 0.02 less than $x$, said n-type layer forming a window for said photons and a heterojunction with said particular p-type layer, and electrode means for coupling to said particular p-type layer and said n-type layer, said electrode means being adapted to admit said photons first to said n-type layer and thereafter to said particular p-type layer.

9. A photodetector according to claim 8 in which the $GaAs_{(1-x)}Sb_x$ and $GaAs_{(1-y)}Sb_y$ layers and a portion of the electrode means comprise a mesa structure disposed on the matching layers, and including dielectric means for guarding against lateral surface leakage and shorting of the heterojunction of the mesa structure.

10. A photodetector according to claim 8 in which the steps in antimony content in each of the matching layers with respect to an adjacent layer vary between 0.02 and 0.10 of the formular group V element content of that layer, and in which $x = 0.13$ and $y = 0.093$ for the particular p-type and n-type layers respectively.

* * * * *